(12) United States Patent
Roberts et al.

(10) Patent No.: US 9,472,299 B2
(45) Date of Patent: Oct. 18, 2016

(54) METHODS AND SYSTEMS FOR MITIGATING MEMORY DRIFT

(71) Applicant: Advanced Micro Devices, Inc., Sunnyvale, CA (US)

(72) Inventors: David A. Roberts, Santa Cruz, CA (US); Michael Ignatowski, Austin, TX (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 218 days.

(21) Appl. No.: 14/257,919

(22) Filed: Apr. 21, 2014

(65) Prior Publication Data
US 2015/0302937 A1    Oct. 22, 2015

(51) Int. Cl.
*G11C 7/00*       (2006.01)
*G11C 16/34*      (2006.01)
*G11C 11/56*      (2006.01)
*G11C 13/00*      (2006.01)

(52) U.S. Cl.
CPC ........... *G11C 16/3418* (2013.01); *G11C 11/56* (2013.01); *G11C 11/5642* (2013.01); *G11C 13/004* (2013.01); *G11C 13/0033* (2013.01)

(58) Field of Classification Search
CPC . G11C 16/3418; G11C 11/56; G11C 13/004; G11C 13/0033; G11C 11/5642
See application file for complete search history.

(56) References Cited

U.S. PATENT DOCUMENTS

2012/0265927 A1*  10/2012  Cho et al. .................... 711/103

OTHER PUBLICATIONS

Moinuddin K. Qureshi et al., "Morphable Memory System: A Robust Architecture for Exploiting Multi-Level Phase Change Memories", In Proceedings of the 37th Annual International Symposium on Computer Architecture (ISCA' 10), Jun. 19-23, 2010, 10 pages, ACM, Saint-Malo, France.
Samsung, "Samsung Unveils its Third Fusion Semiconductor-Flex-OneNAND™", Samsung U.S. News , Mar. 27, 2007, 2 pages, http://www.samsung.com/us/news/3571.
G. Torelli et al., "Mixed Serial-Parallel Sensing Scheme for a 64-Mbit 4-bit/cell Factory-Programmed OTP-ROM", Microelectronics Journal 30, 1999, pp. 875-886.

* cited by examiner

*Primary Examiner* — Richard Elms
*Assistant Examiner* — Mohammed A Bashar
(74) *Attorney, Agent, or Firm* — Park, Vaughan, Fleming & Dowler LLP (57) ABSTRACT

A memory cell is read by measuring a parameter associated with the memory cell with a first resolution to determine a value stored in the memory cell. The parameter is also measured with a second resolution that is finer than the first resolution. The memory cell is reprogrammed to mitigate an offset between the parameter as measured with the second resolution and the parameter as measured with the first resolution.

20 Claims, 7 Drawing Sheets

METHODS AND SYSTEMS FOR MITIGATING MEMORY DRIFT

TECHNICAL FIELD

The present embodiments relate generally to memory technology, and more specifically to reading and programming memory cells.

BACKGROUND

The level (e.g., voltage level or resistance level) of a memory cell may drift over time. Such drift will eventually corrupt the value stored in the memory cell. Multi-level cells (MLCs) that store multiple bits per cell are particularly sensitive to drift, although single-level cells (SLCs) that store a single bit per cell may also suffer from drift. While error-correction coding (ECC) may be used to repair bit errors resulting from drift in memory cells, the use of ECC to detect and correct such errors reduces performance. Accordingly, there is a need for techniques to mitigate memory cell drift.

SUMMARY OF ONE OR MORE EMBODIMENTS

In some embodiments, a method of managing memory includes reading a memory cell by measuring a parameter associated with the memory cell with a first resolution, to determine a value stored in the memory cell. The parameter is also measured with a second resolution that is finer than the first resolution. The memory cell is reprogrammed to mitigate an offset between the parameter as measured with the second resolution and the parameter as measured with the first resolution.

In some embodiments, a system includes an array of memory cells and comparator circuitry configurable to measure a parameter of a selected memory cell of the array with multiple resolutions. The system also includes a controller to specify a first resolution for the comparator circuitry to use to measure the parameter in order for a value stored in the selected memory cell to be determined; to specify a second resolution for the comparator circuit to use to measure the parameter, wherein the second resolution is finer than the first resolution; and to reprogram the memory cell to mitigate an offset between the parameter as measured with the second resolution and the parameter as measured with the first resolution.

In some embodiments, a non-transitory computer-readable storage medium stores one or more programs configured to be executed by a processor in a system that includes the processor and a memory array. The one or more programs include instructions to enable a mode in which memory cells in the memory array are reprogrammed to mitigate respective offsets between respective instances of a parameter associated with the memory cells as measured with a first resolution and as measured with a second resolution. The respective instances of the parameter are measured with the first resolution to determine values stored in the respective memory cells.

BRIEF DESCRIPTION OF THE DRAWINGS

The present embodiments are illustrated by way of example and are not intended to be limited by the figures of the accompanying drawings.

Like reference numerals refer to corresponding parts throughout the figures and specification.

DETAILED DESCRIPTION

Reference will now be made in detail to various embodiments, examples of which are illustrated in the accompanying drawings. In the following detailed description, numerous specific details are set forth in order to provide a thorough understanding of the disclosure. However, some embodiments may be practiced without these specific details. In other instances, well-known methods, procedures, components, and circuits have not been described in detail so as not to unnecessarily obscure aspects of the embodiments.

Figure 1:
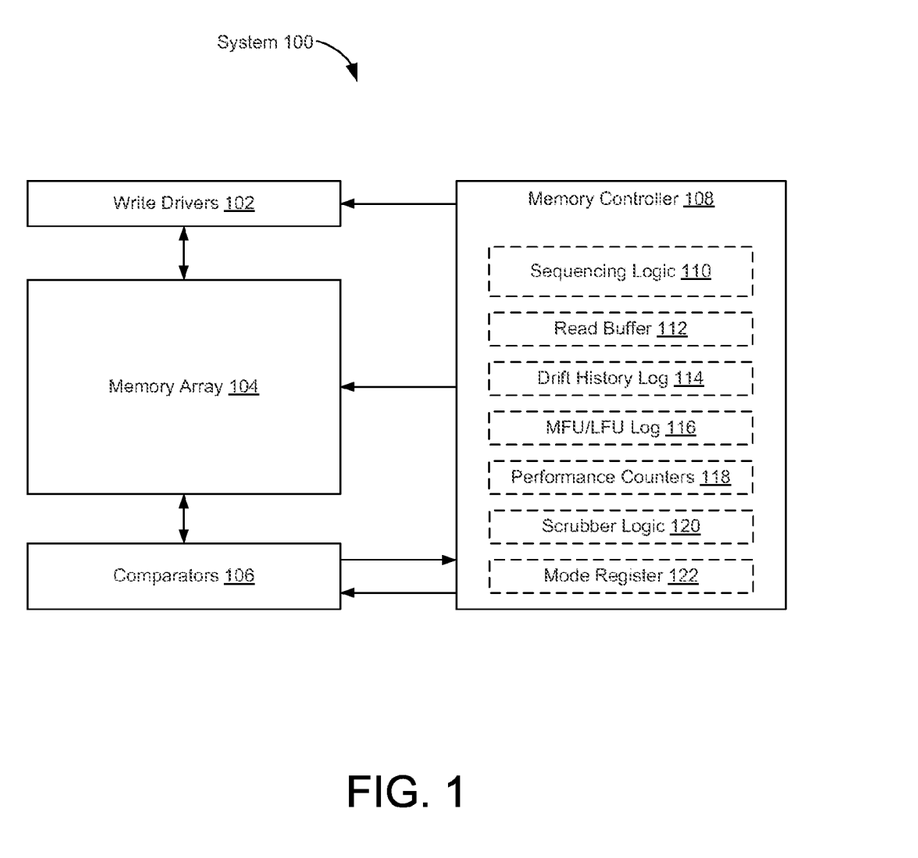
FIG. 1 is a block diagram of a system in which a memory array is coupled to a memory controller in accordance with some embodiments.

FIG. 1 is a block diagram of a system 100 in which a memory array 104 is coupled to a memory controller 108 in accordance with some embodiments. The memory array 104 is an array of memory cells divided into rows and columns. In some embodiments, the system 100 includes multiple memory arrays 104 coupled to the memory controller 108; for example, each memory array 104 may be a bank in a multi-bank memory device (e.g., a multi-bank memory chip) or plurality of multi-bank memory devices. Alternatively, the memory array 104 may be divided into multiple banks (e.g., multiple sub-arrays), each of which is divided into rows and columns. Examples of types of memory that may be used to implement the memory array 104 include, but are not limited to, flash memory, phase-change memory (PCM), and resistive random-access memory (RRAM). The memory array 104 is coupled to write drivers 102 and comparators 106. The write drivers 102 include circuitry for writing data in memory cells at specified addresses in the memory array 104, and thus for programming the memory cells. The comparators 106 include circuitry for reading data stored in memory cells at specified addresses in the memory array 104. (Other peripheral circuitry associated with the memory array 104, such as address decoders, is not shown in FIG. 1 for simplicity.) The memory controller 108 specifies the addresses in the memory array 104 for write and read operations, provides data to the write drivers 102 for write operations, and receives results from the comparators 106 (e.g., for read operations). The memory controller 108 also specifies thresholds to be used by the comparators 106, which are thus configurable in accordance with the specified thresholds. Examples of operation of the comparators 106 are provided below with respect to FIGS. 3A-3C.

In some embodiments, the memory cells in the memory array 104 are multi-level cells (MLCs) that store multiple bits per cell. In other embodiments, the memory cells in the memory array 104 are single-level cells (SLCs) that store single bits per cell. The value stored in each memory cell, whether a single-bit value or a multi-bit value, corresponds to a particular level to which the memory cell has been programmed. This level may be a voltage level (e.g., for flash memory cells) or a resistance level (e.g., for PCM or RRAM memory cells). The level of a memory cell may drift over time, however, which may eventually result in corruption of the value stored in the memory cell. If the value stored in the memory cell is corrupted, reading the memory cell results in an error. Drift may be counteracted by reprogramming the memory cell to reset its level (e.g., its voltage level or resistance level).

Figure 2A:
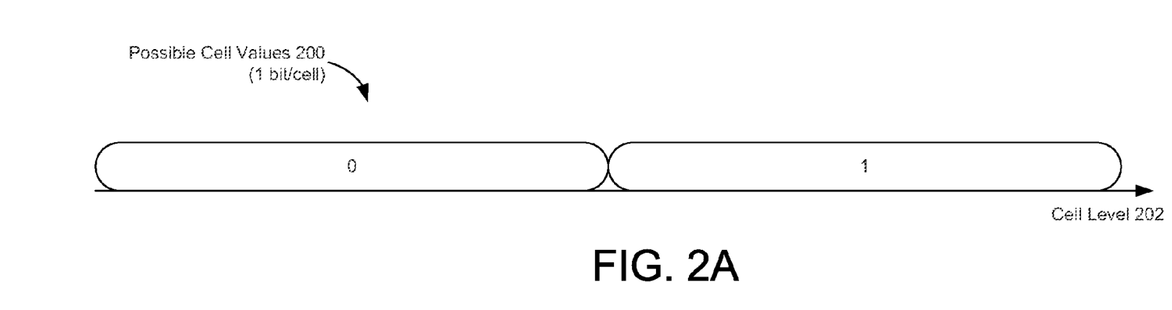
FIGS. 2A-2C show examples of possible values stored in different types of memory cells.
Figure 2B:
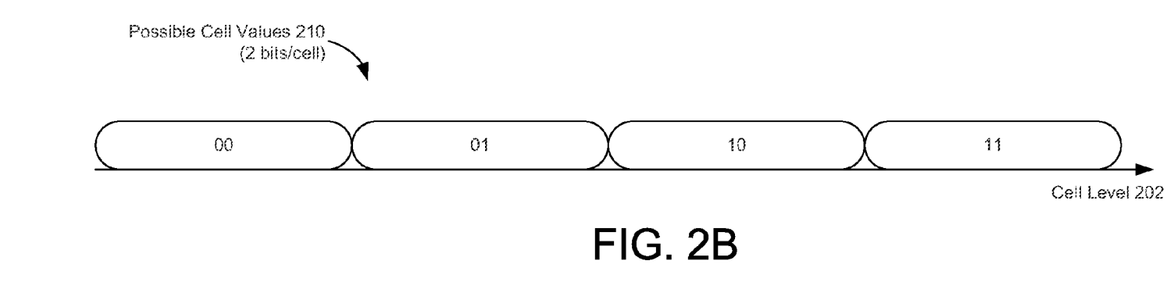
Figure 2C:
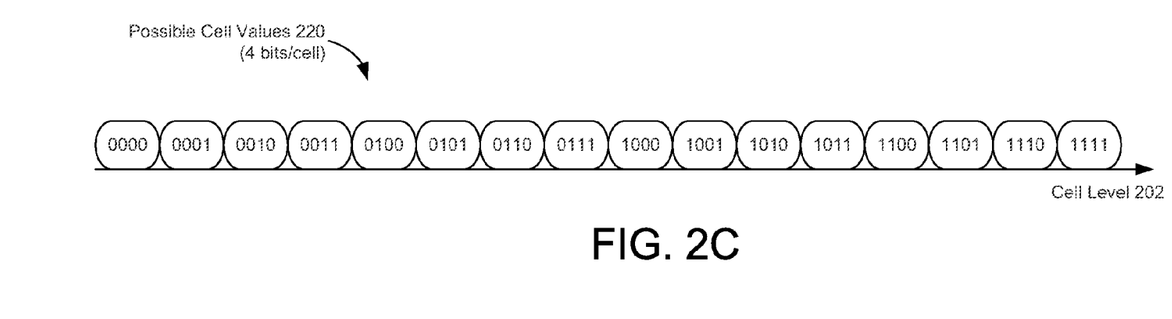

FIGS. 2A-2C show examples of possible values stored in different types of memory cells. FIG. 2A shows possible cell values 200 for SLCs that store 1 bit per cell. The cell level 202 (e.g., the voltage level or resistance level of a memory cell) is divided into two ranges. When the cell level 202 is in a first range, the SLC stores a '0'. When the cell level 202 is in a second range, the SLC stores a '1'. (As FIG. 2A shows, the term 'single-level cell' or SLC is something of a misnomer: each cell has two possible ranges of levels, each corresponding to a distinct bit value. Nevertheless, the term SLC refers to a memory cell that stores a single bit, while the term MLC refers to a memory cell that stores multiple bits, as previously described.) If a cell level 202 drifts to such a degree that it crosses from the first range into the second range, or vice-versa, the value 200 stored in the memory cell becomes corrupted.

FIG. 2B shows possible cell values 210 for MLCs that store two bits per cell. The cell level 202 (e.g., the voltage level or resistance level of a memory cell) is divided into four ranges, with each range corresponding to a distinct two-bit value 210 (i.e., '00', '01', '10', and '11', respectively). The cell level 202 thus specifies the two-bit value 210 stored in the memory cell. If a cell level 202 drifts to such a degree that it crosses from one range into another range, the value 210 stored in the memory cell becomes corrupted.

FIG. 2C shows possible cell values 220 for MLCs that store four bits per cell. The cell level 202 (e.g., the voltage level or resistance level of a memory cell) is divided into 16 ranges, with each range corresponding to a distinct four-bit value 220 as shown. The cell level 202 thus specifies the four-bit value 210 stored in the memory cell. If a cell level 202 drifts to such a degree that it crosses from one range into another range, the value 220 stored in the memory cell becomes corrupted.

The mappings shown in FIGS. 2A-2C between ranges of cell levels 202 and cell values are arbitrary. Different mappings may be used in different implementations. Also, an MLC may store three bits per cell or more than four bits per cell.

If a cell level 202 drifts, it is desirable to reprogram the memory cell to counteract this drift before the drift corrupts the value stored in the memory cell. This reprogramming may be referred to as scrubbing. In some embodiments, the amount by which to scrub the memory cell is determined by measuring a parameter associated with the memory cell with different resolutions and determining an offset between the parameter as measured with a first resolution and the parameter as measured with a second resolution. For example, the read current of the memory cell may be measured at different resolutions. Alternatively, a voltage level of the memory cell may be measured at different resolutions. These measurements may be performed using the comparators 106. The memory controller 108 includes sequencing logic 110 that specifies the different resolutions by specifying thresholds for the comparators 106.

Figure 3A:
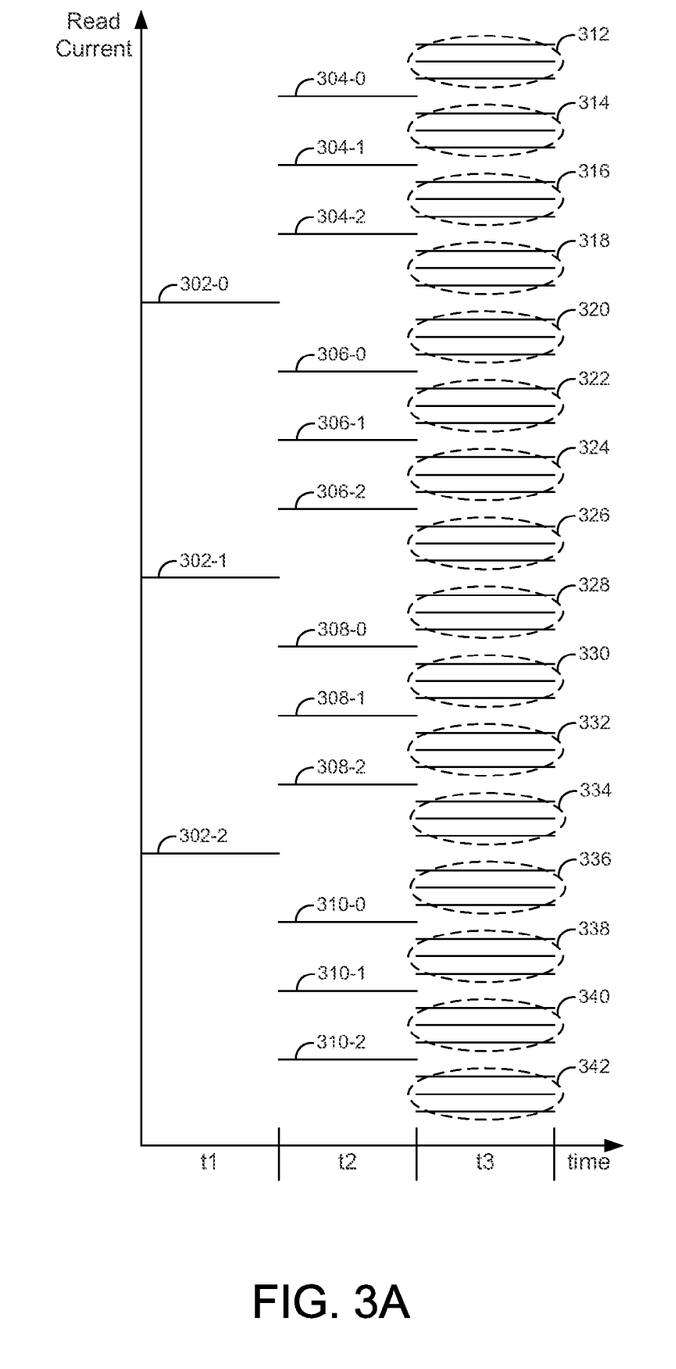
FIG. 3A shows different thresholds that comparators can use to measure the read current of a memory cell in accordance with some embodiments.

FIG. 3A shows different thresholds that comparators 106 can use to measure the read current of a memory cell in accordance with some embodiments. In the example of FIG. 3A, the memory cell being read is an MLC that stores four bits. During the process of reading the memory cell, the read current may be simultaneously provided to three comparators 106, each having a distinct threshold as specified by the memory controller 108 (e.g., by the sequencing logic 110).

During a first time period t1, the comparators 106 are used to compare the read current to three thresholds 302-0, 302-1, and 302-2. Based on the results of these comparisons, three new thresholds are chosen (e.g., by the sequencing logic 110 in the memory controller 108) for use in a second time period t2: the comparators 106 are reconfigured to apply the new thresholds, and the read current is compared to the new thresholds accordingly. If the read current was greater than the threshold 302-0, new thresholds 304-0, 304-1, and 304-2 are chosen. If the read current was less than the threshold 302-0 and greater than the threshold 302-1, new thresholds 306-0, 306-1, and 306-2 are chosen. If the read current was less than the threshold 302-1 and greater than the threshold 302-2, new thresholds 308-0, 308-1, and 308-2 are chosen. If the read current was less than the threshold 302-2, new thresholds 310-0, 310-1, and 310-2 are chosen.

The comparisons performed in the first and second time periods t1 and t2 result in measurement of the read current with a first resolution, by identifying which of 16 possible ranges the read current is in. The thresholds used in the second time period t2 have a spacing that is equal to the first resolution, while the thresholds used in the time period t1 have a spacing that is coarser than the first resolution.

The comparisons performed in the first and second time periods t1 and t2 also result in determination of the value stored in the memory cell. Each of the 16 possible ranges corresponds to a distinct four-bit value. In one example, corresponding to FIG. 2C, the memory cell stores '0000' if the read current is less than the threshold 310-2, stores '0001' if the read current is greater than the threshold 310-2 and less than the threshold 310-1, and so on. The comparisons performed in time periods t1 and t2 thus are an example of a read operation and are performed, for example, in response to a read request provided to the memory controller 108. The memory controller 108 sends a read command to the memory array 104 in response to the read request, and also specifies the thresholds to be used by the comparators 106.

Once the value stored in the memory cell is determined, a third round of comparisons is performed during a third time period t3. The third round of comparisons is performed to quantify memory cell drift. A set of new threshold values is chosen based on the results of the comparisons performed during the first and second time periods t1 and t2, and thus on the value stored in the memory cell. In the example of FIG. 3A, the sets of thresholds available for use during the third time period t3 include sets 312, 314, 316, 318, 320, 322, 324, 326, 328, 330, 332, 334, 336, 338, 340, and 342. Each set corresponds to a read current range as identified in the second time period t2. For example, if the read current is greater than threshold 304-0, set 312 is chosen for use during the third time period t3. If the read current is less than threshold 304-0 and greater than 304-1, set 314 is chosen for use during the third time period t3. The other sets are chosen based on analogous criteria. The comparisons performed during the third time period t3 result in measurement of the read current with a second resolution that is finer than the first resolution.

Figure 3B:
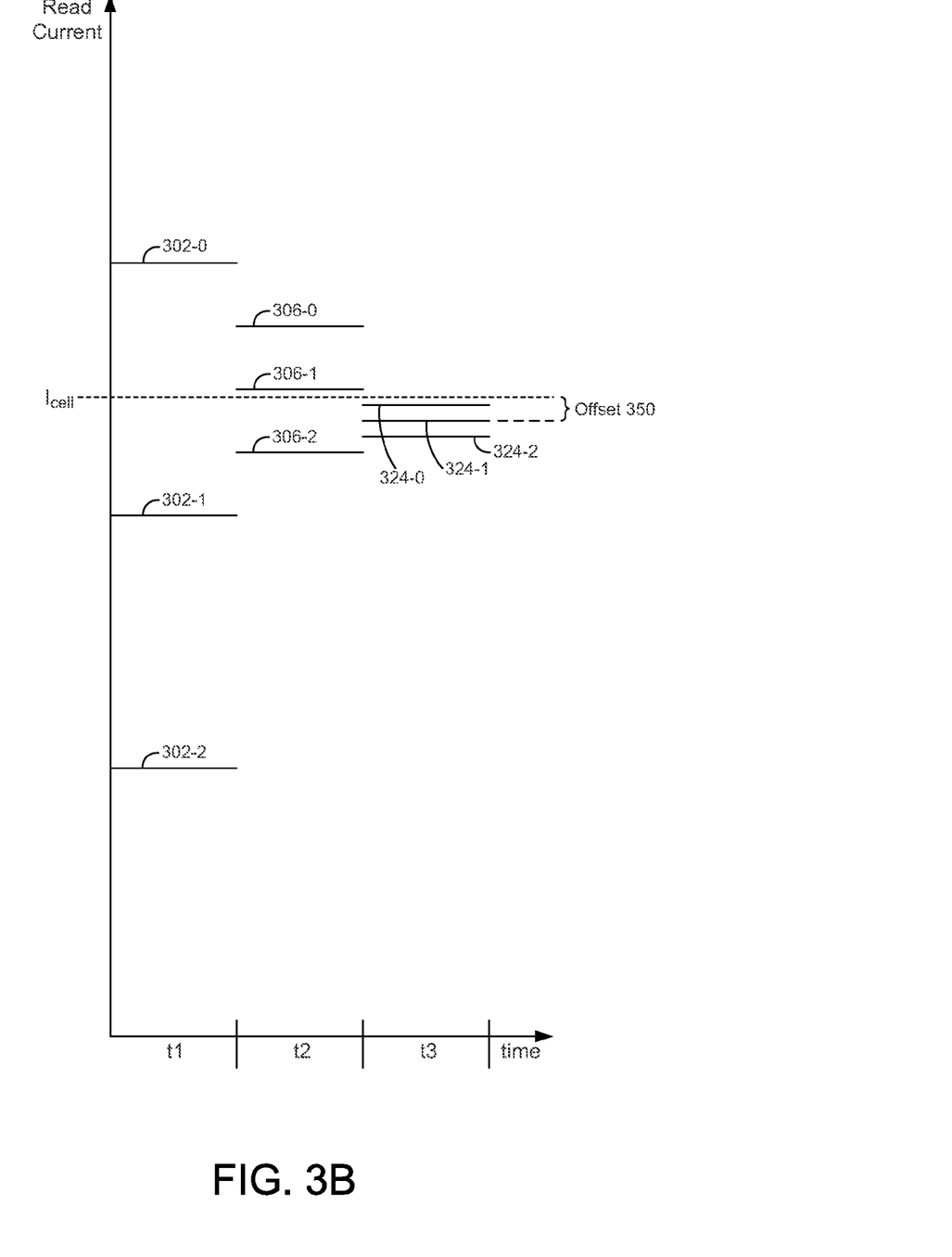
FIGS. 3B and 3C show examples of measuring a memory cell's read current with multiple resolutions, using thresholds from FIG. 3A, in accordance with some embodiments.

FIG. 3B shows an example of measuring a memory cell's read current with both the first and second resolutions, using thresholds from FIG. 3A, in accordance with some embodiments. During the first time period t1, the memory cell's read current $I_{cell}$ is determined to be greater than the threshold 302-1 and less than the threshold 302-0. In response, the thresholds 306-0, 306-1, and 306-2 are chosen for use during the second time period t2. $I_{cell}$ is then determined to be less than the threshold 306-1 and greater than the threshold 306-2. This result provides an indication of the value stored in the memory cell (which, as in the example of FIG. 3A, is a four-bit MLC), and provides a measurement of $I_{cell}$ with the first resolution. Based on this result, thresholds 324-0, 324-1, and 324-2 (which compose the set 324 of FIG. 3A) are chosen for use during the third time period t3. $I_{cell}$ is then determined to be greater than the threshold 324-0 (and is already known to be less than the threshold 306-1). The comparisons performed during the third time period t3 provide a measurement of $I_{cell}$ with the second resolution. The difference between $I_{cell}$ as measured with the second resolution and $I_{cell}$ as measured with the first resolution is an offset 350, which provides an indication of drift. The memory cell may then be reprogrammed to reduce or eliminate the offset 350.

Each measurement of $I_{cell}$ as performed by the comparators 106 determines a range within which $I_{cell}$ is located, as opposed to a precise value of $I_{cell}$. The resolution of the measurement corresponds to the width of the range: the finer the resolution, the narrower the range (and likewise, the coarser the resolution, the wider the range). To determine the offset 350, $I_{cell}$ may be assumed to have a specified value within a given range (e.g., in the middle of the range). For example, in FIG. 3B, $I_{cell}$ as measured with the first resolution may be assumed to have a value in the middle of the range defined by thresholds 306-1 and 306-2, while $I_{cell}$ as measured with the second resolution may be assumed to have a value in the middle of the range defined by thresholds 306-1 and 324-0. The offset 350 is then determined by taking the absolute value of the difference between $I_{cell}$ as measured with the first resolution and $I_{cell}$ as measured with the second resolution.

Figure 3C:
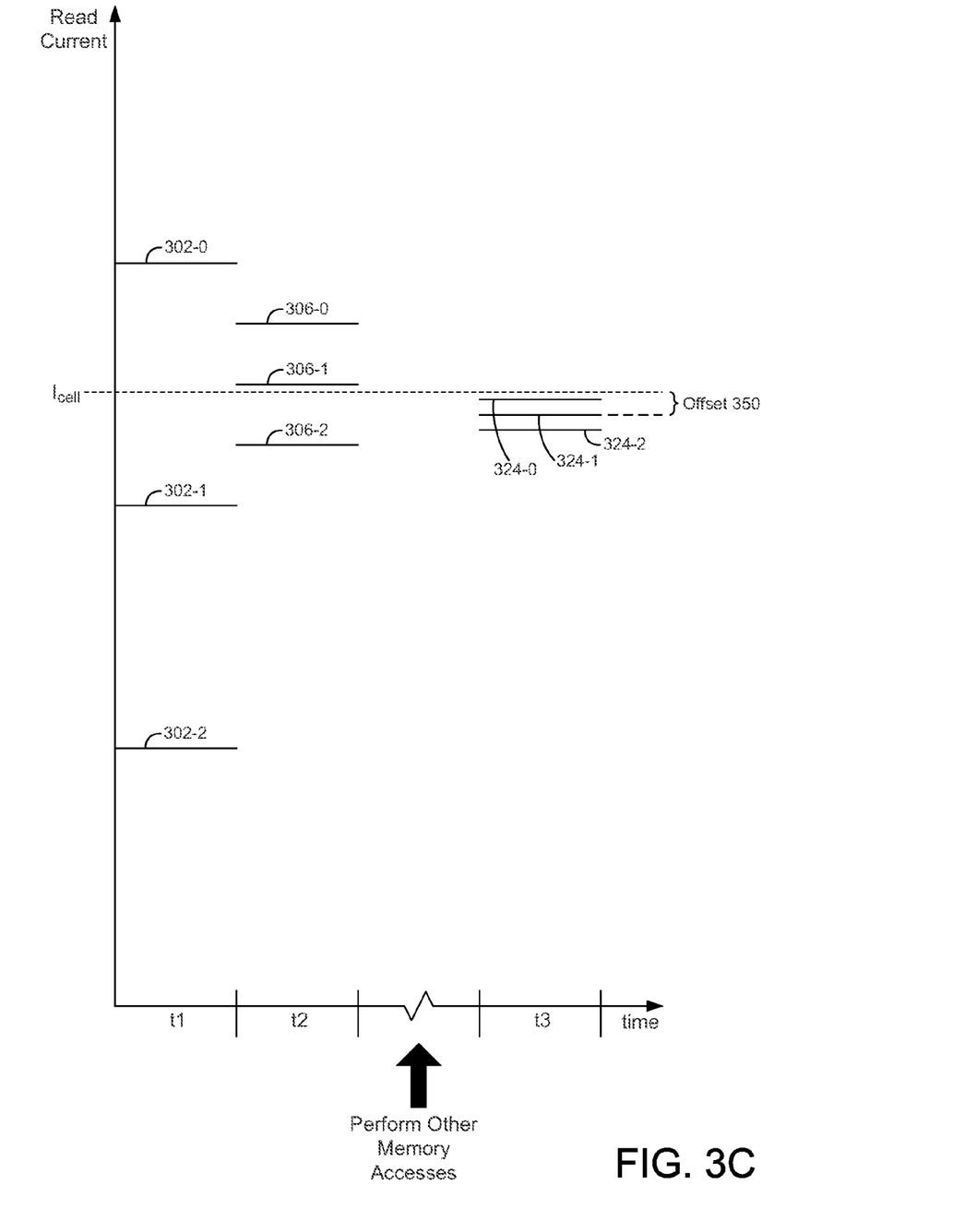

In some embodiments, there is a delay between the second time period t2 and the third time period t3, as shown in FIG. 3C in accordance with some embodiments. Accordingly, there is a delay between measurement of $I_{cell}$ with the first resolution and measurement of $I_{cell}$ with the second resolution. Other memory accesses (e.g., read operations and/or write operations) directed to other memory cells may be performed during the delay. The delay results, for example, from scheduling the measurement of $I_{cell}$ with the second resolution to reduce or minimize its performance impact.

In some embodiments, the memory controller 108 includes a read buffer 112 to buffer the address of the memory cell and the value stored in the memory cell, as determined during the first and second time periods t1 and t2, during the delay. The thresholds used during the third time period may be chosen based on the memory cell's value as buffered in the read buffer 112. This buffering allows the measurement of $I_{cell}$ to be performed with the second resolution after the delay, without re-reading the memory cell. The buffer 112 may store addresses and values of multiple cells. For example the buffer 112 may be a first-in-first-out (FIFO) buffer.

In some embodiments, the memory controller 108 may delay measuring $I_{cell}$ with the second resolution until a level of demand for access to the memory array, and thus a level of contention, satisfies a criterion (e.g., is less than, or less than or equal to, a specified level). For example, the memory controller 108 may include one or more performance counters 118 that measure the level of demand for access to the memory array (e.g., the level of contention) by counting memory access requests. The memory controller 108 may delay measuring $I_{cell}$ until a value or values of the one or more performance counters 118 satisfy a criterion. Contention resulting at least in part from measurements performed with the second resolution is thereby reduced, and system performance is improved accordingly.

In some embodiments, the value stored in a memory cell in the memory array 104, as determined during time periods t1 and t2 and buffered in the read buffer 112, is returned to a processor (e.g., a processor 502, FIG. 5) before the time period t3, in response to a memory access command from the processor. The returned value may be considered speculative data and may be used by the processor 502 to continue execution. A more accurate determination of the value stored in the memory cell may subsequently be made based on the measurement of the time period t3 and provided to the processor 502 as non-speculative data.

In some embodiments, the memory controller 108 includes scrubber logic 120 that periodically measures $I_{cell}$ for various memory cells and reprograms the memory cells accordingly. For example, the scrubber logic 120 periodically measures $I_{cell}$ with the second resolution for memory cells in the memory array 104 using values stored in the read buffer 112, and reprograms the memory cells accordingly based on measured offsets 350. Alternatively, the scrubber logic 120 periodically measures $I_{cell}$ with both the first and second resolutions for memory cells in the memory array 104, and reprograms the memory cells accordingly based on measured offsets 350.

In some embodiments, the memory controller 108 (e.g., the scrubber logic 120) identifies memory cells for which $I_{cell}$ is to be measured with the second resolution using one or more logs. For example, the memory controller 108 may include a drift history log 114 that stores addresses of memory cells previously found to have offsets 350 that satisfy a criterion (e.g., are greater than, or greater than or equal to, a specified value) and/or to have corrupted data that resulted in errors. The memory controller 108 may include a log 116 that tracks most-frequently-used (MFU) and/or least-frequently used (LFU) addresses in the memory array 104. $I_{cell}$ may be measured with the second resolution for memory cells identified in the logs 114 and/or 116, and the memory cells may be reprogrammed accordingly. Scrubbing of MFU memory cells may be desirable because frequent accesses may induce drift. Scrubbing of LFU memory cells may be desirable because drift in LFU memory cells may otherwise go undiscovered and uncorrected in the absence of read operations directed to the LFU memory cells.

In some embodiments, measurement of $I_{cell}$ with the second resolution and the resulting reprogramming are automatically performed (or automatically slotted for subsequent performance after a delay) in response to read commands when the system 100 is in a first mode but not when the system 100 is in a second mode. Similarly, the scrubber logic 120 may be active when the system 100 is in a first mode but not when the system 100 is in a second mode. The memory controller may include a mode register 122 to store a value specifying the mode (e.g., a first value for the first mode and a second value for the second mode). In some embodiments, the mode register 122 is software-programmable.

In FIGS. 3B-3C, two time periods t1 and t2 are used to read the value stored in a memory cell. Alternatively, the value stored in a memory cell may be read in a single time period or in three or more time periods. Since $I_{cell}$ is measured with the first resolution as part of reading the value stored in a memory cell, the number of time periods used to make this measurement may likewise vary. The number of comparators 106 used in a given time period may vary accordingly, and will also vary based on the number of bits stored in the memory cell. In some embodiments, only a single comparator is used in a given time period (e.g., for SLCs). Furthermore, $I_{cell}$ is merely an example of a parameter that may be measured to determine whether to reprogram a memory cell to mitigate drift. In another example, a cell voltage level is measured.

In some embodiments the memory controller 108 (e.g., including the sequencing logic 110, read buffer 112, drift history log 114, MFU/LFU log 116, performance counters 118, scrubber logic 120, and/or mode register 122) is implemented in a single integrated circuit, and thus in a single chip. This integrated circuit may include other circuitry (e.g., one or more processor cores). Alternatively, portions of the memory controller 108 may be implemented in different integrated circuits, and thus in different chips. For example, the sequencing logic 110 may be implemented in a memory device that includes the memory array 104, write drivers 102, and comparators 106, while other elements of the memory controller 108 may be implemented in another integrated circuit (e.g., a processor chip that includes one or more processor cores).

Figure 4:
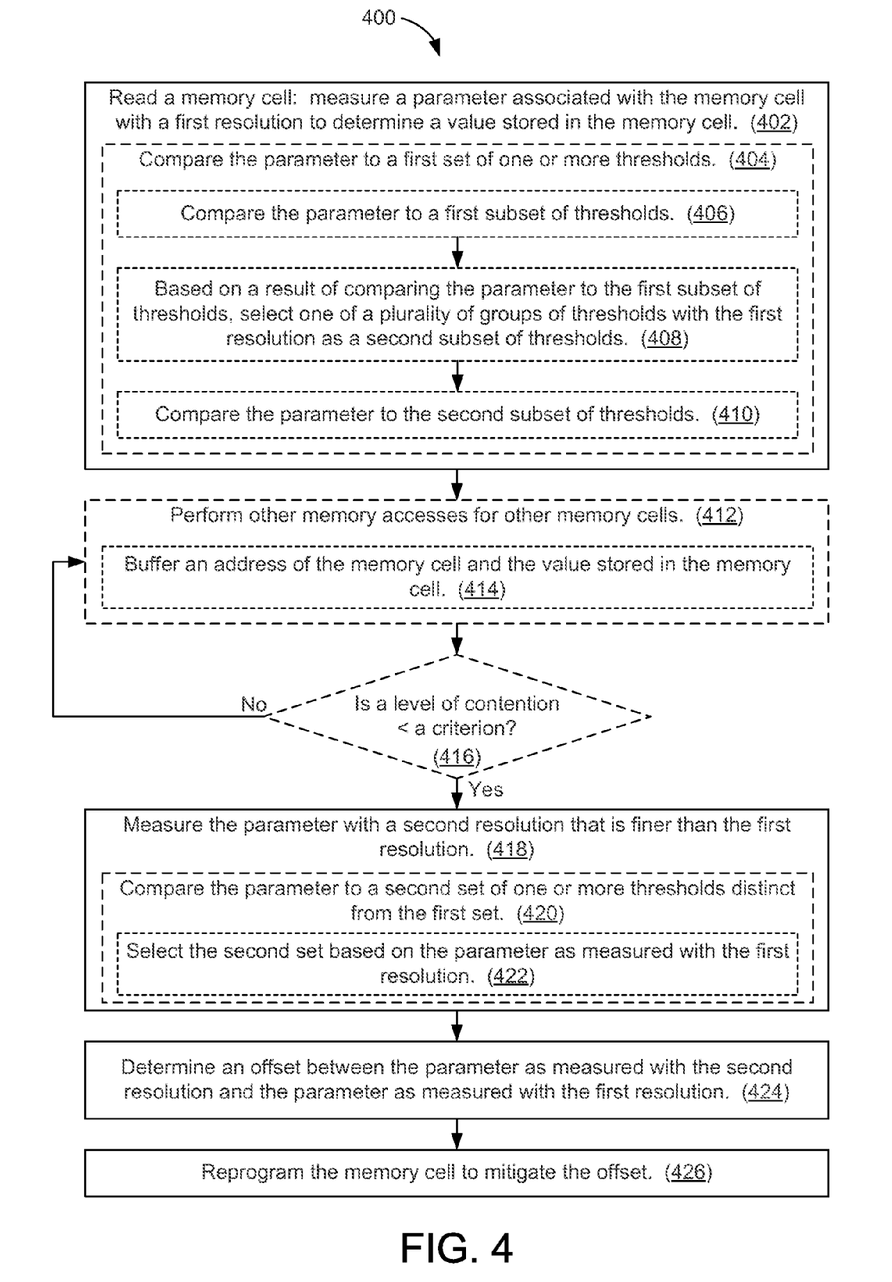
FIG. 4 is a flowchart showing a method of managing memory to mitigate drift in the level of a memory cell in accordance with some embodiments.

FIG. 4 is a flowchart showing a method 400 of managing memory to mitigate drift in accordance with some embodiments. The method 400 is performed, for example, in the system 100 (FIG. 1).

In the method 400, a memory cell (e.g., an MLC, or alternately an SLC) is read (402). Reading the memory cell includes measuring a parameter (e.g., $I_{cell}$, or alternately a voltage level) associated with the memory cell with a first resolution to determine a value stored in the memory cell.

The parameter is measured, for example, by comparing (404) the parameter to a first set of one or more thresholds (e.g., a first set of current thresholds, or alternately a first set of voltage thresholds) using one or more comparators 106 (FIG. 1). In some embodiments, to compare (404) the parameter to the first set of one or more thresholds, the parameter is compared (406) to a first subset of thresholds (e.g., thresholds 302-0, 302-1, and 302-2, FIGS. 3B and 3C). Based on a result of comparing the parameter to the first subset of thresholds, one of a plurality of groups of thresholds with the first resolution is selected (408) as a second subset of thresholds. For example, a group that includes thresholds 306-0, 306-1, and 306-2 is selected, as shown in FIGS. 3B-3C. The parameter is compared (410) to the second subset of thresholds. The second subset of thresholds has the first resolution, while the first subset of thresholds has a coarser resolution than the first resolution (e.g., as shown in FIGS. 3A-3C).

In some embodiments, the read operation 402 is performed in response to a read request (e.g., as provided to the memory controller 108 and directed to the memory array 104). The value stored in the memory cell, as read in the read operation 402, is provided in response to the read request.

The parameter is measured (418) with a second resolution that is finer than the first resolution (i.e., the first resolution is coarser than the second resolution). For example, the parameter is compared (420) to a second set of one or more thresholds (e.g., a second set of current thresholds, or alternately a second set of voltage thresholds) distinct from the first set, using one or more comparators 106 (FIG. 1). In the example of FIG. 3C, the parameter is compared to the thresholds 324-0, 324-1, and 324-2. In some embodiments, the second set is selected (422) based on the parameter as measured with the first resolution. This selection is performed, for example, by the sequencing logic 110 (FIG. 1).

An offset (e.g., offset 350, FIGS. 3B-3C) is determined (424) between the parameter as measured with the second resolution and the parameter as measured with the first resolution. The memory cell is reprogrammed (426) to mitigate (e.g., to entirely or partially eliminate) the offset. In some embodiments, the memory cell is reprogrammed in response to a determination that the offset satisfies a criterion (e.g., is greater than, or greater than or equal to, a specified amount).

In some embodiments, after reading (402) the memory cell and before measuring (418) the parameter with the second resolution, other memory accesses are performed (412) for other memory cells in the memory array 104. A delay is thus introduced between reading (402) the memory cell (which involves measuring the parameter with the first resolution) and measuring (418) the parameter with the second resolution. During this delay, while performing (412) the other memory accesses, an address of the memory cell and the value stored in the memory cell are buffered (414) (e.g., in the read buffer 112, FIG. 1). Subsequent selection (422) of the second set of one or more thresholds (e.g., by the sequencing logic 110, FIG. 1) is based on the buffered value (which was determined based on the parameter as measured with the first resolution).

In some embodiments, a determination is made (416) (e.g. in the memory controller 108) as to whether a degree of contention, and thus a level of demand, for accessing the memory array 104 satisfies (e.g., is less than, or less than or equal to) a criterion (e.g., a specified level). If the criterion is not satisfied (416-No), other memory accesses continue to be performed (412), thereby further delaying measuring (418) the parameter with the second resolution during periods of high memory access bandwidth, to prevent the measurement of operation 418 from impacting system performance. If the criterion is satisfied (416-Yes), however, the method 400 proceeds to the operation 418 and the parameter is measured with the second resolution.

In some embodiments, the operations 412, 414, and/or 416 may be omitted.

In some embodiments, the parameter is measured (418) with the second resolution in response to inclusion of the address of the memory cell in the drift history log 114, a log 116 of MFU addresses, or a log 116 of LFU addresses (FIG. 1).

In some embodiments, it is determined (e.g., by the memory controller 108, FIG. 1) whether the offset of operation 424 satisfies a criterion (e.g., is greater than, or greater than or equal to, a specified amount). If the criterion is satisfied, the parameter is measured with the first and second resolutions for one or more other memory cells that are within a specified distance of (e.g., physically adjacent to) the memory cell that is the subject of the method 400. An offset between the parameter as measured with the second resolution and as measured with the first resolution is determined for each of these one or more other memory cells. The memory cells are then reprogrammed to mitigate the offset. In some embodiments, a respective memory cell of the one or more other memory cells is reprogrammed to mitigate the offset if the offset satisfies a criterion (e.g., is greater than, or greater than or equal to, a specified amount).

While the method 400 includes a number of operations that appear to occur in a specific order, it should be apparent that the method 400 can include more or fewer operations. Two or more operations may be combined into a single operation and performance of two or more operations may overlap. In some embodiments, the method 400 may include one or more additional parameter measurements in addition to the measurements of operations 402 and 418. For example, the method 400 may include one or more additional parameter measurements performed after the operation 418, each having a finer resolution than the previous parameter measurement. In another example, the method 400 may include one or more additional parameter measurements performed between the measurements of operations 402 and 418, with successively finer resolutions that are finer than the first resolution but coarser than the second resolution. The offset of operation 424 may be determined as the offset between the parameter as measured in a final measurement with a finest resolution and the parameter as measured in a previous measurement (e.g., the measurement of operation 402 or 418) with a resolution that is coarser than the finest resolution.

Figure 5:
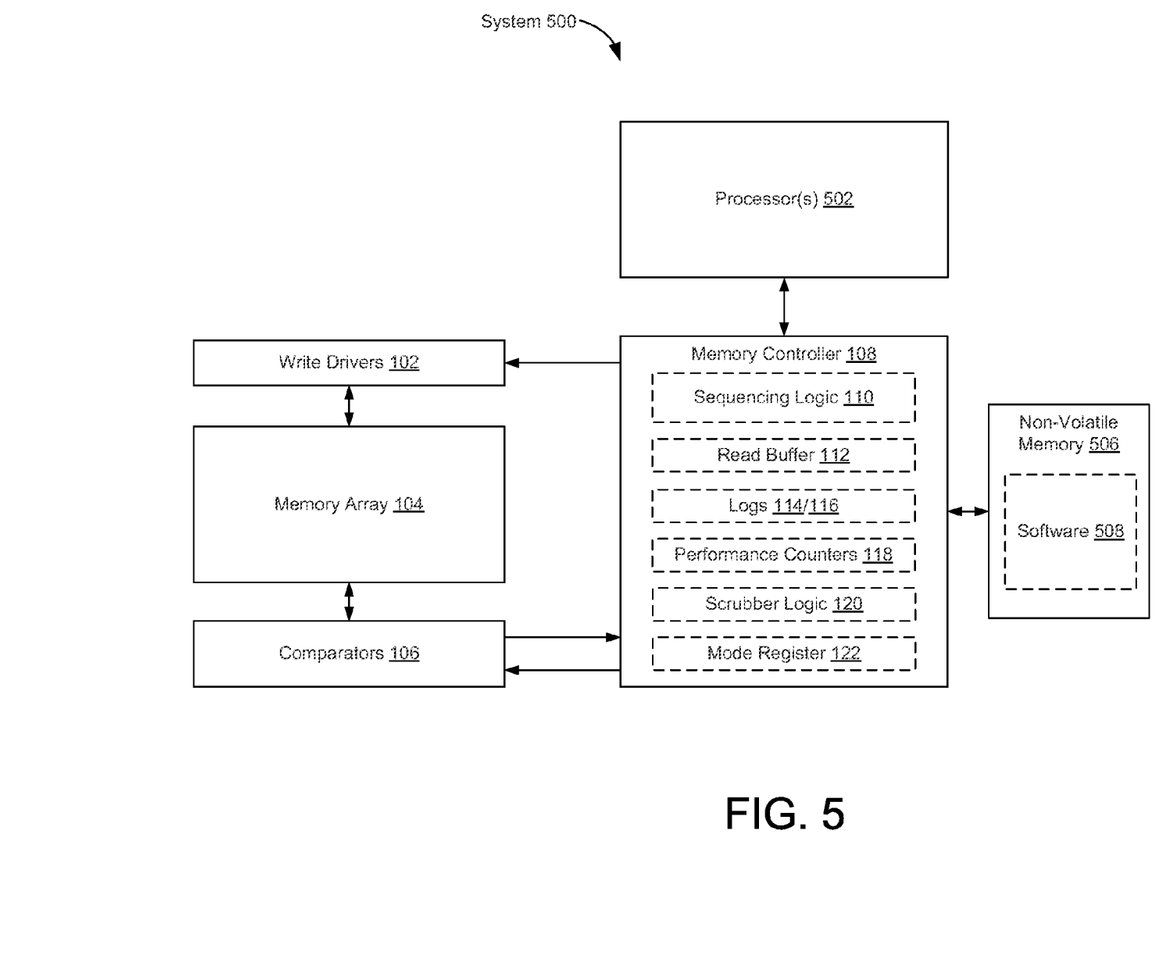
FIG. 5 is a block diagram of a system that includes the system of FIG. 1 and further includes one or more processors and non-volatile memory storing software, in accordance with some embodiments.

FIG. 5 is a block diagram of a system 500 that includes the system 100 and further includes one or more processors 502 and non-volatile memory 506 coupled to the memory controller 108 in accordance with some embodiments. The non-volatile memory 506 may be coupled, directly or indirectly, to the memory controller 108. Examples of the non-volatile memory 506 include, but are not limited to, a read-only memory (ROM), flash memory, phase-change memory, and a hard-disk drive. The non-volatile memory 506 includes a non-transitory computer-readable storage medium that stores software 508. The software 508 includes one or more programs with instructions configured for execution by the one or more processors 502. In some embodiments, the software 508 includes instructions to enable and disable a mode in which memory cells in the memory array 104 are reprogrammed to mitigate respective offsets between respective instances of a parameter (e.g., $I_{cell}$, or a voltage level) associated with the memory cells as measured with a first resolution and as measured with a second resolution (e.g., in accordance with the method 400, FIG. 4). For example, the software 508 includes instructions to program the mode register 122.

In some embodiments, the memory controller 108 is implemented in hardware. Alternatively, all or a portion of the functionality of the memory controller 108 may be implemented in software. For example, the memory controller 108 may include a processor and the software 508 may include instructions that, when executed by the processor of the memory controller 108, provide all or a portion of the functionality of the memory controller 108 as described herein. For example, the software 508 may include instructions that, when executed by the processor of the memory controller 108, result in performance of all or a portion of the method 400 (FIG. 4).

The foregoing description, for purpose of explanation, has been described with reference to specific embodiments. However, the illustrative discussions above are not intended to be exhaustive or to limit all embodiments to the precise forms disclosed. Many modifications and variations are possible in view of the above teachings. The disclosed embodiments were chosen and described to best explain the underlying principles and their practical applications, to thereby enable others skilled in the art to best implement various embodiments with various modifications as are suited to the particular use contemplated.

What is claimed is:

1. A method of managing memory, comprising:
   reading a memory cell, the reading comprising measuring a parameter associated with the memory cell with a first resolution to determine a value stored in the memory cell;
   measuring the parameter with a second resolution that is finer than the first resolution;
   determining an offset between the parameter as measured with the first resolution and the parameter as measured with the second resolution, the offset corresponding to an amount of drift in the parameter between measuring the parameter with the first resolution and measuring the parameter with the second resolution; and
   reprogramming the memory cell to mitigate the offset.

2. The method of claim 1, wherein:
   measuring the parameter with the first resolution comprises comparing the parameter to a first set of one or more thresholds;
   measuring the parameter with the second resolution comprises comparing the parameter to a second set of one or more thresholds distinct from the first set; and
   the method further comprises selecting the second set based on the parameter as measured with the first resolution.

3. The method of claim 2, wherein:
   the parameter comprises a read current of the memory cell;
   the first set of one or more thresholds comprises a first set of one or more current thresholds; and
   the second set of one or more thresholds comprises a second set of one or more current thresholds.

4. The method of claim 2, wherein:
   the memory cell is a multi-level cell;
   the value stored in the memory cell comprises multiple bits;
   the first set of one or more thresholds comprises a first plurality of thresholds; and
   the second set of one or more thresholds comprises a second plurality of thresholds.

5. The method of claim 4, wherein:
   the first set of one or more thresholds comprises a first subset of thresholds with a coarser resolution than the first resolution and a second subset of thresholds with the first resolution; and
   comparing the parameter to the first set of one or more thresholds comprises:
   comparing the parameter to the first subset of thresholds;
   based on a result of comparing the parameter to the first subset of thresholds, selecting one of a plurality of groups of thresholds with the first resolution as the second subset of thresholds; and
   comparing the parameter to the second subset of thresholds.

6. The method of claim 1, wherein the memory cell is situated in a memory array and reading the memory cell is performed in response to a read request directed to the memory array, the method further comprising:
   providing the value stored in the memory cell in response to the read request;
   after providing the value, delaying measuring the parameter with the second resolution; and
   while delaying measuring the parameter with the second resolution, performing memory accesses in the memory array.

7. The method of claim 6, further comprising:
  while delaying measuring the parameter with the second resolution, buffering an address of the memory cell and the value stored in the memory cell;
  wherein measuring the parameter with the second resolution comprises selecting a set of one or more thresholds with the second resolution based on the buffered value and comparing the parameter to the selected set of one or more thresholds.

8. The method of claim 6, wherein delaying measuring the parameter with the second resolution comprises delaying measuring the parameter with the second resolution until a level of demand for access to the memory array is less than, or less than or equal to, a specified level.

9. The method of claim 1, wherein:
  the memory cell is situated in a memory array;
  the method further comprises maintaining a log of least-frequently-read addresses in the memory array; and
  measuring the parameter with the second resolution is performed in response to inclusion of an address of the memory cell in the log of least-frequently-read addresses.

10. The method of claim 1, wherein:
  the memory cell is situated in a memory array;
  the method further comprises maintaining a log of most-frequently-read addresses in the memory array; and
  measuring the parameter with the second resolution is performed in response to inclusion of an address of the memory cell in the log of most-frequently-read addresses.

11. The method of claim 1, wherein:
  the memory cell is situated in a memory array;
  the method further comprises maintaining a log of addresses of bits having drift that satisfies a criterion; and
  measuring the parameter with the second resolution is performed in response to previous inclusion of an address of the memory cell in the log.

12. The method of claim 1, wherein the memory cell is a first memory cell in a memory array and the offset is a first offset, the method further comprising:
  determining that the first offset satisfies a criterion; and
  in response to determining that the first offset satisfies the criterion:
  measuring the parameter with the first resolution and the second resolution for a second memory cell that is physically adjacent to the first memory cell in the memory array;
  determining a second offset between the parameter as measured for the second memory cell with the second resolution and the parameter as measured for the second memory cell with the first resolution; and
  reprogramming the second memory cell to mitigate the second offset.

13. A system, comprising:
  a controller to couple to an array of memory cells and to comparator circuitry coupled to the array, wherein the controller is to:
    specify a first resolution for the comparator circuitry to use to measure a parameter of a selected memory cell of the array in order for a value stored in the selected memory cell to be determined;
    specify a second resolution for the comparator circuit to use to measure the parameter, wherein the second resolution is finer than the first resolution;
    determine an offset between the parameter as measured with the first resolution and the parameter as measured with the second resolution, the offset corresponding to an amount of drift in the parameter between measuring the parameter with the first resolution and measuring the parameter with the second resolution; and
    reprogram the memory cell to mitigate the offset.

14. The system of claim 13, further comprising:
  the array of memory cells; and
  the comparator circuitry,
  wherein the comparator circuitry is configurable to measure the parameter with the first resolution and with the second resolution.

15. The system of claim 14, wherein:
  the comparator circuitry comprises one or more comparators to compare the parameter to one or more respective thresholds, to measure the parameter;
  the controller is to specify the first resolution by specifying a first set of one or more respective thresholds for the one or more comparators; and
  the controller is to specify the second resolution by specifying a second set of one or more respective thresholds for the one or more comparators.

16. The system of claim 15, wherein:
  the memory cells of the array comprise multi-level cells to store multiple bits per cell;
  the comparator circuitry comprises a plurality of comparators;
  the first set of one or more respective thresholds comprises a first plurality of thresholds; and
  the second set of one or more respective thresholds comprises a second plurality of thresholds.

17. The system of claim 16, wherein:
  the first set of one or more respective thresholds comprises a first subset of respective thresholds with a coarser resolution than the first resolution and a second subset of respective thresholds with the first resolution; and
  to specify the first resolution, the controller is to:
    specify the first subset of respective thresholds for use by the plurality of comparators;
    select the second subset of respective thresholds from a plurality of groups of thresholds with the first resolution, based on a result from the comparator circuitry of measuring the parameter using the first subset of respective thresholds; and
    specify the second subset of respective thresholds for use by the plurality of comparators.

18. The system of claim 15, wherein:
  the controller is to delay specifying the second set of one or more respective thresholds after the value stored in the selected memory cell has been determined;
  the controller is to provide memory access commands to the array while delaying specifying the one or more respective thresholds;
  the controller comprises a buffer to store an address of the selected memory cell and the value stored in the selected memory cell while delaying specifying the second set of one or more respective thresholds; and
  the controller is to select the second set of one or more respective thresholds based on the value as stored in the buffer.

19. The system of claim 18, wherein the controller is to delay specifying the second set of one or more respective thresholds until a level of demand for access to the array is less than, or less than or equal to, a specified level.

20. A non-transitory computer-readable storage medium storing one or more programs configured to be executed by a processor in a system comprising the processor and a memory array, the one or more programs comprising instructions that, when executed by the processor, cause the processor to perform a method comprising:
  reading a memory cell in the memory array, the reading comprising measuring a parameter associated with the memory cell with a first resolution to determine a value stored in the memory cell;
  measuring the parameter with a second resolution that is finer than the first resolution;
  determining an offset between the parameter as measured with the first resolution and the parameter as measured with the second resolution, the offset corresponding to an amount of drift in the parameter between measuring the parameter with the first resolution and measuring the parameter with the second resolution; and
  reprogramming the memory cell to mitigate the offset.

* * * * *